(12) United States Patent
Gruner et al.

(10) Patent No.: US 10,416,569 B2
(45) Date of Patent: Sep. 17, 2019

(54) ATTENUATION FILTER FOR PROJECTION LENS, PROJECTION LENS HAVING ATTENUATION FILTER FOR PROJECTION EXPOSURE APPARATUS, AND PROJECTION EXPOSURE APPARATUS HAVING PROJECTION LENS

(71) Applicant: Carl Zeiss SMT GmbH, Oberkochen (DE)

(72) Inventors: Toralf Gruner, Aalen-Hofen (DE); Ricarda Schoemer, Zusmarshausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/131,326

(22) Filed: Sep. 14, 2018

(65) Prior Publication Data
US 2019/0064676 A1 Feb. 28, 2019

Related U.S. Application Data

(63) Continuation of application No. PCT/EP2017/056909, filed on Mar. 23, 2017.

(30) Foreign Application Priority Data

Apr. 5, 2016 (DE) .......................... 10 2016 205 619

(51) Int. Cl.
*G03F 7/20* (2006.01)
*G02B 5/22* (2006.01)
(Continued)

(52) U.S. Cl.
CPC ......... *G03F 7/70191* (2013.01); *G02B 5/208* (2013.01); *G02B 5/22* (2013.01);
(Continued)

(58) Field of Classification Search
CPC ...... G02B 5/208; G02B 5/22; G02B 27/0025; G03F 7/70091; G03F 7/70191;
(Continued)

(56) References Cited

U.S. PATENT DOCUMENTS

| 5,621,498 A | 4/1997 | Inoue et al. |
| 2005/0179996 A1* | 8/2005 | Weigl ..................... G02B 5/208 |
| | | 359/359 |

(Continued)

FOREIGN PATENT DOCUMENTS

| DE | 10 2007 021 649 A1 | 11/2007 |
| WO | WO 2014/139719 A1 | 9/2014 |

OTHER PUBLICATIONS

German Office Action, with translation thereof, for corresponding DE Appl No. 10 2016 205 619.0, dated Dec. 20, 2016.

(Continued)

*Primary Examiner* — Colin W Kreutzer
(74) *Attorney, Agent, or Firm* — Fish & Richardson P.C.

(57) ABSTRACT

An attenuation filter is configured to define attenuation of the intensity of ultraviolet radiation with a specified working wavelength from a wavelength range of 150-370 nm according to a specifiable local distribution in a projection lens of a microlithographic projection exposure apparatus. The attenuation filter has a substrate and an absorption layer on the substrate. The substrate is sufficiently transparent at the working wavelength. The absorption absorbs incident ultraviolet radiation of the working wavelength according to the specifiable local distribution at different locations of a used area to varying degrees. The attenuation filter reduces or avoids a thermally induced wavefront variation error in the ultraviolet radiation which has passed through the attenuation filter owing to locally varying heating of the substrate, which is caused by the absorption of the ultraviolet radiation (Continued)

that varies locally over the substrate. A thickness of the substrate is less than 100 μm.

20 Claims, 4 Drawing Sheets

(51) Int. Cl.
  G02B 27/00 (2006.01)
  G02B 5/20 (2006.01)
(52) U.S. Cl.
  CPC ..... G02B 27/0025 (2013.01); G03F 7/70091 (2013.01); G03F 7/70241 (2013.01); G03F 7/70308 (2013.01); G03F 7/70891 (2013.01); G03F 7/70958 (2013.01)
(58) Field of Classification Search
  CPC ............. G03F 7/70241; G03F 7/70308; G03F 7/70891; G03F 7/70958
  USPC ..................................................... 355/67, 71
  See application file for complete search history.

(56) References Cited

U.S. PATENT DOCUMENTS

| | | |
|---|---|---|
| 2007/0209029 A1 | 9/2007 | Ivonin et al. |
| 2008/0032207 A1* | 2/2008 | Graeupner ................ G03F 1/36 430/5 |
| 2009/0122289 A1 | 5/2009 | Vladimirsky et al. |
| 2010/0231883 A1 | 9/2010 | Dodoc et al. |
| 2013/0278910 A1 | 10/2013 | Ikezawa et al. |
| 2016/0291223 A1* | 10/2016 | Rudigier-Voigt ...... G02B 5/223 |

OTHER PUBLICATIONS

Written Opinion and International Search Report for corresponding PCT Appl No. PCT/EP2017/056909, dated Jul. 7, 2017.

* cited by examiner

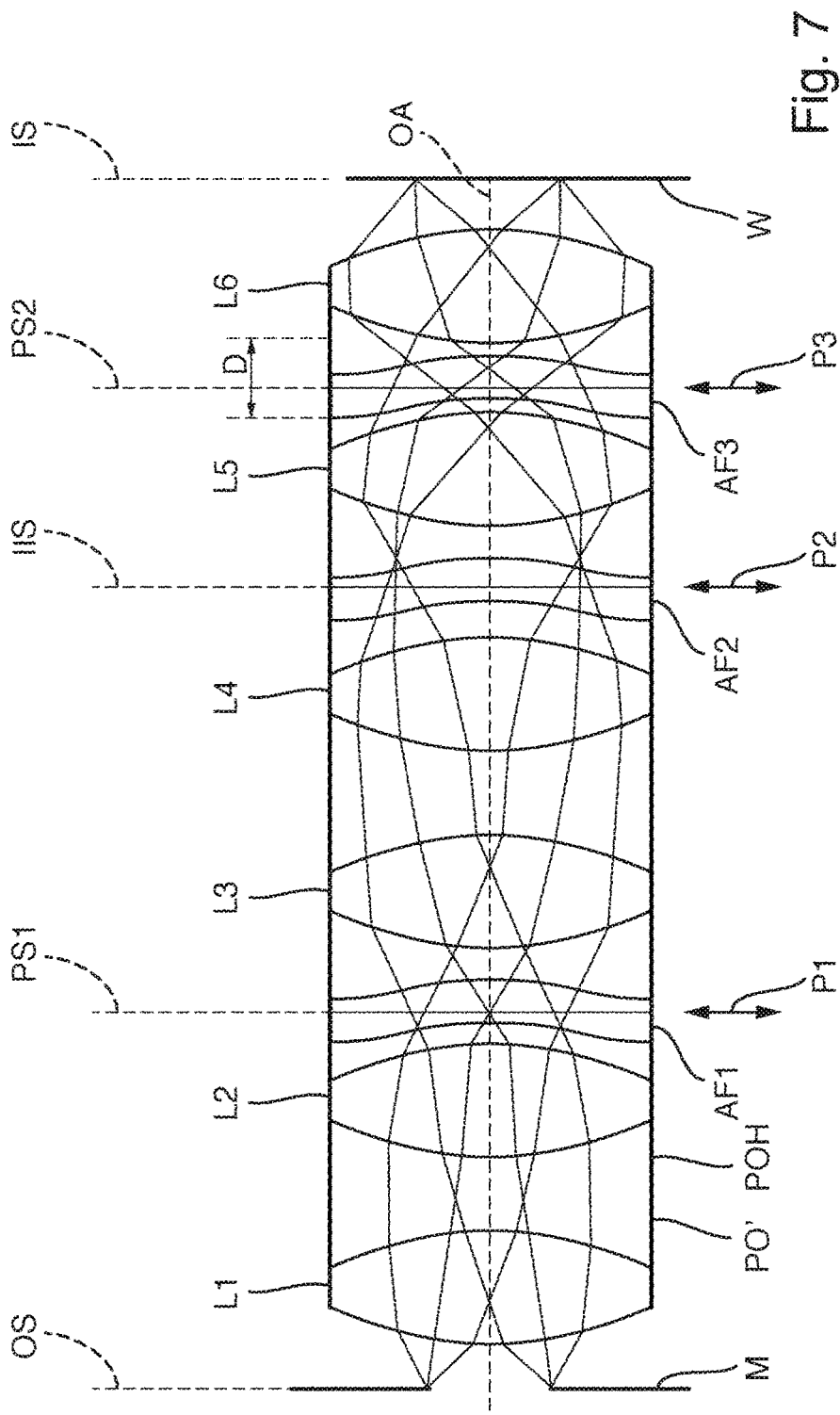

ATTENUATION FILTER FOR PROJECTION LENS, PROJECTION LENS HAVING ATTENUATION FILTER FOR PROJECTION EXPOSURE APPARATUS, AND PROJECTION EXPOSURE APPARATUS HAVING PROJECTION LENS

CROSS REFERENCE TO RELATED APPLICATIONS

The present application is a continuation of, and claims benefit under 35 USC 120 to, international application PCT/EP2017/056909, filed Mar. 23, 2017, which claims benefit under 35 USC 119 of German Application No. 10 2016 205 619.0, filed Apr. 5, 2016. The entire disclosure of these applications are incorporated by reference herein.

FIELD

The disclosure relates to an attenuation filter for a projection lens, to a projection lens having such an attenuation filter for a projection exposure apparatus, and to a projection exposure apparatus having a microlithographic projection lens of this type.

BACKGROUND

These days, it is predominantly microlithographic projection exposure methods that are used for producing semiconductor components and other finely structured components, such as e.g. photolithography masks. In this case, use is made of masks (reticles) or other patterning devices that bear or form a pattern of a structure to be imaged, for example a line pattern of a layer of a semiconductor component. The pattern is positioned in the region of an object plane of the projection lens between an illumination system and a projection lens in a projection exposure apparatus and is illuminated by illumination radiation provided by the illumination system. The radiation modified by the pattern travels in the form of projection radiation through the projection lens, which images the pattern with a reduced scale onto the wafer to be exposed or onto the substrate to be exposed. The surface of the wafer is arranged in an image plane of the projection lens that is optically conjugate to the object plane. The wafer is generally coated with a radiation-sensitive layer (resist, photoresist).

One of the aims in the development of projection exposure apparatuses is to lithographically produce structures having smaller and smaller dimensions on the wafer. In the case of semiconductor components, for example, smaller structures lead to higher integration densities, which generally has a favourable effect on the performance of the microstructured components produced. Projection lenses exhibiting good imaging performance are desired for this purpose.

The small size of the structures to be imaged and the increasingly small size of the structures to be produced and the ultimate size and other limiting factors of the projection lens give rise to specific issues. By way of example, what are known as optical proximity effects can occur in the projection lens. In the structures produced, the effects can cause the produced structures to deviate in a typical manner from the associated forms of the structures to be imaged on the mask. For correcting optical proximity effects, DE 10 2007 021 649 A1 discloses an optical attenuation filter, which is designed in the form of a transmission filter for installation in the region of the pupil plane of a projection lens and exhibits a transmittance that varies as a function of the pupil spatial coordinate.

SUMMARY

The disclosure seeks to design an attenuation filter of the type mentioned in the introductory part such that the attenuation filter is improved as compared to the prior art and can contribute to the improvement of the imaging performance of the projection lens if possible without causing undesired secondary effects. The disclosure also seeks to provide a projection lens having such an attenuation filter and a projection exposure apparatus having such a projection lens.

In one aspect, the disclosure provides an attenuation filter for the defined attenuation of the intensity of ultraviolet radiation with a specified working wavelength from a wavelength range of 150 nm to 370 nm according to a specifiable local distribution in a projection lens of a microlithographic projection exposure apparatus. The attenuation filter includes a substrate, which is sufficiently transparent at the working wavelength. The attenuation filter also includes an absorption layer, which is arranged on the substrate and absorbs incident ultraviolet radiation of the working wavelength according to the specifiable local distribution at different locations of a used area to varying degrees. The attenuation filter is configured to reduce or avoid a thermally induced wavefront variation error in the ultraviolet radiation which has passed through the attenuation filter owing to a locally varying heating of the substrate caused by the absorption of the ultraviolet radiation which varies locally over the substrate. A thickness of the substrate is less than 100 μm.

In another aspect, the disclosure provides a projection lens for use in a microlithographic projection exposure apparatus for imaging a pattern arranged in an object plane of the projection lens into an image plane (of the projection lens using ultraviolet radiation having a working wavelength from a wavelength range of 150 nanometers (nm) to 370 nm. The projection lens includes a multiplicity of optical elements, which are arranged between the object plane and the image plane. The projection lens also includes at least one attenuation filter according to one of the present disclosure, which is arranged during operation in the projection beam path between the object plane and the image plane.

In a further aspect, the disclosure provides a projection exposure apparatus for the exposure of a substrate, which is to be exposed and is arranged in the region of an image plane of a projection lens with at least one image of a pattern of a mask. The pattern is arranged in an object plane of the projection lens. The projection exposure apparatus includes an illumination system for receiving ultraviolet radiation with a specified working wavelength from a wavelength range of 150 nm to 370 nm of an ultraviolet radiation source and for shaping illumination radiation that is directed onto the pattern. The projection exposure apparatus also includes a projection lens for imaging the pattern onto the wafer. The projection lens is configured according to the present disclosure.

The attenuation filter according to the disclosure is configured for the defined attenuation of the intensity of ultraviolet radiation with a specified working wavelength from a wavelength range of 150 nm to 370 nm according to a specifiable local distribution in a projection lens of a microlithographic projection exposure apparatus.

Typical radiation sources for microlithography with ultraviolet radiation are mercury vapour lamps having a working wavelength of 365 nm, KrF excimer lasers having a working wavelength of 248 nm, ArF excimer lasers having a working wavelength of 193 nm and $F_2$ excimer lasers having a working wavelength of 157 nm. A range of 370 to 315 nm is frequently referred to as near UV range, a range of 315 to 280 nm is frequently referred to as medium UV range, a range of 280 to 200 nm is frequently referred to as deep UV range (DUV), and a range of 200 nm to 150 nm is frequently referred to as vacuum UV range (VUV).

In special variants, the attenuation filter is designed for the defined attenuation of the intensity of ultraviolet radiation having a specified working wavelength of only part of or one of the wavelength ranges stated, preferably of the VUV range.

The local distribution can be specified for example by way of the properties of the projection lens without attenuation filter being measured and by determining the local distribution from a comparison of the measured properties with the desired properties of the projection lens.

The attenuation filter has a substrate and an absorption layer. The substrate is sufficiently transparent at the specified working wavelength. The absorption layer is arranged on the substrate such that the substrate carries the absorption layer. The absorption layer absorbs incident ultraviolet radiation of the specified working wavelength according to the specifiable local distribution at different locations of a used area to varying degrees. As a result, transmission properties can be influenced in a location-dependent fashion.

Sufficiently transparent can in this case mean that the substrate can transmit at least 90%, in particular at least 95%, with preference at least 99%, of incident ultraviolet radiation of the specified working wavelength. Ideally, practically only the absorption layer should absorb the incident ultraviolet radiation, such that no "unnecessary" absorption of the ultraviolet radiation by the substrate can occur. This can permit high illumination intensities and thus a high wafer throughput and a cost-effective semiconductor chip manufacturing.

The absorption strength of the absorption layer can vary for example continuously or in steps of 0.1 to 1%, for example in the range of 0% to 20%, in particular in the range of 0% to 10%. At a maximum absorption of 20%, at most 20% of the incident ultraviolet radiation is absorbed at one location, with the result that a large portion of the ultraviolet radiation can pass through the attenuation filter.

The substrate serves as the carrier of the absorption layer, with the result that the absorption layer can be so thin that it may be fragile and non-self-supporting. The absorption layer can be arranged on an entry side of the substrate, i.e. on the side of the substrate on which the ultraviolet radiation is incident on the substrate or enters it. Alternatively, the absorption layer can be arranged on an exit side of the substrate, opposite the entry side, i.e. on the side of the substrate on which the ultraviolet radiation exits the substrate. It is possible for an absorption layer to be present both at the entry side and at the exit side. The absorption layer can be applied on the surface of the substrate in direct contact therewith or be separated from the substrate by way of one or more layers in between.

The used area is the region of the attenuation filter through which ultraviolet radiation passes during operation. The used area can correspond to the entire surface of the substrate or only to a partial surface of the substrate. In particular, the attenuation filter can have attachment structures for attachment of the attenuation filter in the projection lens, with the attachment structures being able to engage in the substrate outside the used area. A diameter of the surface area of the substrate or of the used area can be from 10 mm (10 millimeters), in particular from 20 mm, in particular from 30 mm, in particular from 80 mm, to 400 mm, in particular to 300 mm. The used area can be, for example, in the shape of a rectangle having rounded corners, a kidney, a circle or an ellipse.

According to the claimed disclosure, the attenuation filter is designed for reducing or avoiding a thermally induced wavefront variation error in the ultraviolet radiation which has passed through the attenuation filter owing to locally varying heating of the substrate, which is caused by the absorption of the ultraviolet radiation that varies locally over the substrate. In other words, in the attenuation filter according to the claimed disclosure, special measures are taken which can at least partially compensate for a thermally induced wavefront variation error in the ultraviolet radiation which has passed through the attenuation filter, or substantially prevent it altogether.

It has been found that the locally varying absorption of the ultraviolet radiation can result in a locally varying heating of the absorption layer and as a result in a locally varying heating up of the substrate. The heating up of the substrate which varies in a locationally dependent fashion can have a location-dependent influence on the phase or the wavefront of the ultraviolet radiation which has passed through, owing to thermal expansion of the substrate and/or a temperature dependence of the refractive index of the substrate. The rays of a projection beam of the ultraviolet radiation which travel from one point in the object plane to the image plane form a wavefront. Due to the heating up of the substrate which varies in a locationally dependent fashion, rays that pass through the attenuation filter in each case at different locations can be subjected to a different influence on their phase. As a result, the wavefront of the ultraviolet radiation which has passed through can deviate from the wavefront of the incident ultraviolet radiation. Deviations of the wavefront of the ultraviolet radiation which has passed through from a wavefront specified by the specification are here referred to as wavefront variation errors and can result in imaging errors that cannot be tolerated. The specification becomes increasingly narrow as part of the production of structures with increasingly small dimensions, with the result that deviations which until now have not been a problem and therefore have not been taken into account can now no longer be tolerated. Owing to its construction, the attenuation filter according to the disclosure permits the reduction or outright prevention of a thermally induced wavefront variation error.

The attenuation filter can moreover be designed to correct wavefront variation errors which are caused by other elements within the projection lens.

Microlithographic projection lenses demand very accurate manufacturing of the optical elements of the projection lens. A problem here, among others, is that the true state of the optical elements cannot be measured at the working wavelength with sufficient accuracy until they are in the assembled state. At this stage, what remains for a retroactive correction is frequently only a very complicated partial disassembly of the projection lens and post-processing of the optical elements. However, such manufacturing inaccuracies or manufacturing errors can also be retroactively corrected by using the attenuation filter. Using the attenuation filter, it is likewise possible to correct drift effects or lifetime effects (e.g. soiling, degradation) after the original assembly and adjustment of the projection lens.

Attenuation of the intensity of the ultraviolet radiation by reflection at the attenuation filter is advantageously low to negligible as compared to the absorption, which can be advantageous in particular for applications where avoidance of stray light and/or high integral transmittance of the attenuation filter are desired. In particular, the attenuation filter can have at least one anti-reflection layer for reducing or avoiding reflection.

According to a wording of the claimed disclosure, a thickness of the substrate is less than 100 μm (100 micrometers). The thickness can be, for example, at most 90 μm or less, or at most 80 μm or less, or at most 70 μm or less, or at most 60 μm or less, or at most 50 μm or less. The thickness can in particular be at most 20 μm, with preference even at most 10 μm. The substrate should thus be relatively thin as compared to substrates of conventional filters.

Owing to the relatively low substrate thickness, thermal expansion of the substrate in absolute terms, if any, is relatively low. As a consequence, differences in any thermal expansion at various locations of the substrate owing to the locally varying heating of the substrate can also only be relatively low. In addition, a change of the typically temperature-dependent refractive index of the substrate takes effect via a through-passage path length for the ultraviolet radiation which passes through the substrate. The through-passage path length will typically be of the size order of the substrate thickness and thus be relatively low for a relatively low substrate thickness. As a consequence, differences in the refractive index at various locations of the substrate owing to the locally varying heating of the substrate only have a low effect. Moreover, thermal expansion of the substrate, if any, in particular in combination with attachment of the attenuation filter and, associated therewith, clamping of the substrate, can result in curvature of the entry-side and/or exit-side surface of the substrate. This can result in a lateral offset of rays, which pass through the substrate in each case at different locations, relative to one another. The ray offset will typically be dependent on the substrate thickness and thus be relatively low for a relatively low substrate thickness. The low substrate thickness therefore allows for any disturbing thermally induced wavefront variation error in the ultraviolet radiation that has passed through the attenuation filter to be avoided from the outset or at least to be kept small.

The thickness of the substrate is preferably at least 5 μm, preferably at least 10 μm. Consequently, the substrate is resistant or robust with respect to external influences— during the manufacturing, during the installation in the projection lens and during use in the projection lens. By way of example, a gas flow (air or nitrogen) can be present in a projection lens during flushing or pumping of the projection lens, which gas flow can have an effect on the attenuation filter. The resistance to external influences can be enhanced by way of a sufficient thickness of the substrate.

The substrate can be a flexible film. However, the substrate is preferably dimensionally stable. In other words, the substrate is resistant in terms of its shape with respect to external influences, such as for example gravity, or maintains its shape under the action of external influences. A dimensionally stable substrate is easy to handle. The substrate can advantageously be a plate. The latter can be, for example, a plane-parallel plate.

It may be expedient to select the thickness of the substrate, among others, in dependence on the specified installation position in the beam path of a projection lens, or to adapt it to the optical conditions in the region of the installation position. This is true in particular for applications where the attenuation filter is intended to be inserted in the form of a retrofit component in a projection lens, which was originally calculated without an optical element at the specified installation position, for the purpose of subsequent imaging performance correction. In this case, the attenuation filter should cause no more than a change as small as possible in the optical path lengths and/or the beam paths within the projection lens. The change should be as small as possible, with the result that it can be compensated for by way of existing manipulation features in the projection lens (for example by displacing a displaceable lens or the like). Calculations have shown that installation positions in the region of collimated radiation, for example in a pupil plane or optically near a pupil plane, are in this respect more tolerant than installation positions near field planes (for example near the object plane, the image plane or any intermediate image). For installation positions in the region of a pupil plane, acceptable substrate thicknesses can be, for example, in a range of 10 μm to 50 μm or to 90 μm or 100 μm. For installation positions at intermediary sites (between pupil plane and nearest field plane or near a field plane), significantly lower maximum substrate thicknesses seem to be preferred, for example in the range of 5 μm to at most 30 μm or below.

In a development of the disclosure, the thickness of the substrate varies locally, wherein the thickness variation is adapted to the absorption which varies locally over the substrate. Consequently, it is possible to counteract the thermally induced wavefront variation error, which was mentioned in the introductory part, from the outset. The local thickness variation can be adapted to a typical intensity of the incident ultraviolet radiation during exposure operation, wherein the intensity will generally also substantially determine the locally varying heating of the absorption layer and of the substrate. The thickness variation can be introduced in the substrate for example by way of processing the substrate with an ion beam. This process can be referred to as nano-asphericization of the substrate. One side of the substrate can be planar, and the other side can have the surface deformation, or both sides can have a surface deformation. The local thickness variation can be in a range of 0.1 nm to 10 nm, in particular in a range of 1 nm to 10 nm, which is achievable in process-technological terms for example by way of ion beam processing.

In a development of the disclosure, the attenuation filter has a wavefront correction layer which is separate from the absorption layer and can be arranged, for example, between the substrate and the absorption layer, or on the side of the absorption layer that is remote from the substrate, or on the side of the substrate that is opposite the absorption layer. The wavefront correction layer partially or completely consists of a correction layer material having a refractive index that is greater than 1 at the specified working wavelength. The thickness of the wavefront correction layer, that is to say the correction layer thickness, varies locally over the substrate. The thickness variation is adapted to the absorption which varies locally over the substrate. Consequently, it is possible to counteract the thermally induced wavefront variation error, which was mentioned in the introductory part. The local thickness variation can be adapted to a typical intensity of the incident ultraviolet radiation during exposure operation. The wavefront correction layer is advantageously sufficiently transparent at the specified working wavelength. The wavefront correction layer can be applied on the surface of the substrate and/or of the absorption layer in direct contact therewith or be separated from the substrate and/or the absorption layer by way of one or more layers in between. The local thickness variation can be in a range of 0.1 nm to 10 nm, in particular in a range of 1 nm to 10 nm, which is achievable in process-technological terms for example by way of ion beam processing. The substrate serves as the carrier of the wavefront correction layer, with the result that the wavefront correction layer can be so thin that it may be fragile and non-self-supporting.

The configuration of the substrate with a locally varying substrate thickness or the configuration of the substrate in combination with a separate wavefront correction layer with a locally varying correction layer thickness over the substrate, with a thickness of the substrate being less than 100 µm, can also be advantageous, independently of the absorption layer, for correcting wavefront variation errors caused by other elements in the projection lens and can represent a patentable disclosure. In other words, the absorption layer can be dispensed with. Such a component can be referred to as a wavefront correction filter.

The relatively low thickness allows for an arrangement of the wavefront correction filter at any free position in the projection lens. The local variation of the substrate thickness and/or of the correction layer thickness, in as far as the wavefront correction layer is present, can be specified for example by way of the properties of the projection lens without wavefront correction filter being measured and by determining the local thickness variation from a comparison of the measured properties with the desired properties of the projection lens. What was stated above and will be stated below regarding the attenuation filter, in particular regarding the substrate and the wavefront correction layer, also applies to the wavefront correction filter.

The present disclosure thus also concerns, among other things, a subject matter that can be worded, for example, as follows: wavefront correction filter for the defined correction of the wavefront of ultraviolet radiation with a specified working wavelength from a wavelength range of 150 nm to 370 nm according to a specifiable local distribution of a wavefront variation in a projection lens of a microlithographic projection exposure apparatus, including: a substrate which is sufficiently transparent at the working wavelength and has a locally varying substrate thickness within a used area, wherein the substrate thickness at least in the used area is less than 100 µm (or is not 100 µm or more at any site of the used area). The wavefront correction filter may also be referred to as a wavefront correction element. The thin substrate can be aspherized for example on one substrate surface or on both substrate surfaces. At least one of the substrate surfaces can thus be a rotationally symmetric or rotationally asymmetric aspheric surface.

The absorption layer can have a constant layer thickness at least over the used area, wherein the locally varying absorption strength of the absorption layer can manifest by a material of the absorption layer absorbing ultraviolet radiation that is incident at different locations to varying degrees. In other words, a density or concentration of absorption centres can be of varying size at different locations.

However, the absorption layer preferably has an absorption layer material that absorbs the incident ultraviolet radiation of the specified wavelength and is largely identical or homogeneous independently of location. The absorption layer thickness of the absorption layer locally varies over the substrate according to the specifiable local distribution, such that the variation of the absorption is achieved substantially by way of a corresponding thickness variation of the absorption layer. The absorption layer thickness can here regionally drop to the value zero, causing the existence of regions of the used area without absorption layer. The absorption layer material is selected such that, at the specified working wavelength, it has an effective cross section such that a desired dynamic of the absorption can be set substantially via the layer thickness of the absorption layer material. The absorption layer thickness preferably varies continuously.

In a development of the disclosure, the absorption layer consists partially or completely of a metal, a carbide and/or a metal oxide. It is possible with these materials to set the absorption strength of the absorption layer with low thickness variation as desired in a locally varying fashion. For metals, such as for example titanium (Ti), which absorb ultraviolet radiation of the wavelength range of 150 nm to 370 nm relatively strongly, an absorption thickness in the range of 0% to 20% with a layer thickness which is settable relatively well by process-technological approaches can be achieved by way of the fact that the absorption layer does not need to be locally closed. Locally not closed can mean, for example, that metal islands having a diameter in the range of 10 µm to 100 µm can be provided at a distance in the range of 50 mm to 200 µm nm in order to set the absorption at a determined location to a desired value. By way of example, in the case of a titanium layer having a layer thickness of 14 nm, it is possible to locally achieve an absorption of 1% by way of a local surface coverage of approximately 1% to 2%. Such a layer can act similarly to a dithering structure and be produced, for example, using screen printing. In particular, materials that have long-term resistance to the ultraviolet radiation from the wavelength range of 150 nm to 370 nm should be selected.

In a development of the disclosure, the absorption layer partially or completely consists of tantalum pentoxide ($Ta_2O_5$), hafnium oxide ($HfO_2$) and/or aluminium oxide ($Al_2O_3$). The use of one or more of these strongly absorbing materials for the absorption layer allows for the entire spectrum of desired absorption from nearly no absorption (low layer thickness or substrate regions without absorption layer) up to strong absorption of the incident ultraviolet radiation by one or more percent to be covered with a maximum absorption layer thickness of 20 nm, 10 nm, 5 nm or below. Here, the absorption layer can be locally closed or have a local surface coverage of 100%, with the exception of previously mentioned regions of the used area without absorption layer, if present. In particular, tantalum pentoxide and hafnium oxide are particularly well-suited for a working wavelength of 193 nm, and aluminium oxide is particularly well-suited for a working wavelength of 157 nm.

This low layer thickness of the absorption layer provides, as a further advantage, for the absorption layer to be effectively made anti-reflective by way of an anti-reflective layer of simple construction. In particular, homogeneous anti-reflective treatment, i.e. anti-reflective treatment with anti-reflective action which is nearly uniform over the entire used area, is possible by way of an anti-reflective layer having a largely uniform thickness, because local thickness gradients of the absorption layer generally become so small that this has only a negligible influence on the local angles of incidence on the coating surface. Furthermore, these materials can be applied easily onto the substrate using PVD (physical vapour deposition). In addition, the materials have excellent long-term resistance to the ultraviolet radiation from the vacuum UV range. Tantalum pentoxide and hafnium oxide are particularly well-suited for a working wavelength of 193 nm, and aluminium oxide is particularly well-suited for a working wavelength of 157 nm.

In a development of the disclosure, the substrate partially or completely consists of synthetic quartz glass ($SiO_2$) (fused silica) or crystalline fluoride, such as e.g. $MgF_2$, $CaF_2$ or $BaF_2$. These substrate materials are highly transparent for and resistant to ultraviolet radiation having a working wavelength from a wavelength range of 150 nm to 370 nm. In particular, synthetic quartz glass, $MgF_2$ and $CaF_2$ are particularly well-suited for a working wavelength of 193 nm and $MgF_2$, $CaF_2$ and $BaF_2$ are particularly well-suited for a working wavelength of 157 nm. Materials such as $SiO_2$, $MgF_2$, $CaF_2$ and $BaF_2$ can also be used as layer materials for the wavefront correction layer. Furthermore, aluminium oxide ($Al_2O_3$) can be used for a working wavelength of 193 nm and/or longer for the wavefront correction layer.

In a development of the disclosure, the absorption layer consists partially or completely of a doped glass. The glass can partially or completely consist in particular of at least one of the materials mentioned previously for the substrate, in particular quartz glass and/or $CaF_2$. The glass can be doped in particular with an element of the rare-earth elements, such as e.g. cerium (Ce) and/or yttrium (Y), and/or lead (Pb), in the case of quartz glass preferably with cerium.

In a development of the disclosure, the absorption layer absorbs incident ultraviolet radiation of the specified working wavelength in the middle or the centre of the used area more strongly than in a peripheral region or at the periphery of the used area. In particular, the absorption strength can drop in the peripheral region to the value zero. The used area can have a symmetric form, in particular a rotationally symmetric form. Accordingly, the absorption strength can have a symmetric form.

The projection lens according to the disclosure is configured for use in a microlithographic projection exposure apparatus for imaging a pattern of a mask arranged in the object plane of the projection lens or another pattern generation device into the image plane of the projection lens using the ultraviolet radiation having the working wavelength from the wavelength range of 150 nm to 370 nm. The projection lens has a multiplicity of optical elements, such as lens elements and mirrors. The optical elements are arranged between the object plane and the image plane, with the image plane being optically conjugate to the object plane. Furthermore, the projection lens has at least one attenuation filter according to the disclosure. The attenuation filter is arranged in operation, in particular in projection exposure operation, in the projection beam path between the object plane and the image plane. The ultraviolet radiation, which is changed by the pattern, travels in the form of projection radiation through the projection lens and is incident here during projection exposure operation on the used area of the attenuation filter according to the disclosure and passes through it. The ultraviolet radiation is influenced in the projection lens by the optical elements. The attenuation filter can be used for example to correct or compensate for an undesired secondary effect of an optical element or of the mask. To this end, the attenuation filter can be arranged at a similar position as the component to be corrected or as a position, which is optically conjugate thereto, in the projection beam path.

The attenuation filter can be arranged at different positions in the projection beam path with respect to the desired correction effect. In a development of the disclosure, at least one pupil plane, which has been optically Fourier transformed to the object plane and to the image plane, is located in the projection lens between the object plane and the image plane. The attenuation filter can be arranged in the pupil plane or in the proximity or in the region of the pupil plane. Being arranged in the proximity of the pupil plane can mean here that the attenuation filter is spatially closer to the pupil plane along the projection beam path than to the object plane, the image plane or an intermediate image plane, if present, which is optically conjugate to the object plane.

The projection lens can provide good imaging performance if the complex amplitude in the image plane achieved during operation coincides, within the given tolerances, with the complex amplitude in the image plane which is desired in accordance with the specification. The complex amplitude in one point in the image plane can be described using a phase and an absolute part (or an absolute value). The phase of the complex amplitude is often also described as a wavefront. Of the absolute part of the complex amplitude, among others the profile thereof over the pupil plane is important. This profile over the pupil plane describes the intensity distribution in the exit pupil of the projection lens. This intensity distribution can be described quantitatively by the pupil transmission function, which describes the total transmission as a function of pupil local coordinates.

The pupil transmission function or the corresponding intensity distribution in the exit pupil of the projection lens can be changed in targeted fashion by the attenuation filter which is introduced in the pupil plane or in the proximity of a pupil plane in the projection beam path and has a local transmission profile or a variation of the transmission over the effective cross section or the used area of the filter. Such filtering is occasionally referred to as pupil filtering or apodization. This is possible using the attenuation filter according to the claimed disclosure substantially without causing a wavefront variation error or a negative influence on the phase.

Especially in projection lenses having a relatively high aperture, different rays starting from one point in the object plane travel (with substantially identical optical path length) different geometric distances and are incident on the optical surfaces of lens elements or other optical elements of the projection lens with strongly varying angles of incidence. Rays that travel along the optical axis or for the entire length relatively close to the optical axis typically undergo greater absorption within the optical dense lens element material than rays which travel mainly at the periphery of the lens elements. In the reverse case, it is possible especially in the case of marginal rays for especially high angles of incidence to occur on the optical surfaces, as a result of which generally greater reflection losses arise for these rays than for rays which pass at least approximately perpendicularly through the optical surfaces. Consequently, it can be seen, among others, that different rays that start from the same object point "see" a different total transmission on their paths through the projection lens. This effect can be represented by the "pupil transmission" or the associated pupil transmission function.

Specifically when using phase-shift masks ("Levinson" type) in which no first order of diffraction is produced, the influence of the pupil transmission function on the imaged structures can be pronounced. Such masks are particularly sensitive, because for them, the otherwise always occurring zero order of diffraction is suppressed. Structures of varying periods can thus query completely disjunct pupil regions such that variations in the pupil intensity distribution can exhibit a strong effect. In transmission masks, independently of the structure period, a portion of zero diffraction order which experiences the same pupil transmission always makes a contribution. As a result, transmission masks tend to be influenced less by variations in the pupil intensity distribution. It may of course be the case in individual instances that a specific phase-shift mask illuminates less critical pupil regions than a concrete transmission mask.

Variations of the surface angles of incidence (incidence angles) of the rays at the optical surfaces which are due to the optical design, variations in the layer production of optical coatings, variations in the lens element material and any contamination on optical surfaces are typical influence factors which can result in changes in the pupil transmission function. There is therefore a desire for options for compensating for such undesired effects. Specifically, without causing other undesired secondary effects.

Rays having a relatively smaller ray angle typically experience greater transmission through the optical elements of the projection lens than rays having a relatively larger ray angle. It can therefore be advantageous if the absorption layer absorbs incident ultraviolet radiation of the specified working wavelength more strongly in the centre of the used area than in the peripheral region of the used area. It is thus possible to even out the transmission in the exit pupil.

In a development of the disclosure, the attenuation filter is configured in the form of a structurally interchangeable attenuation filter. It is thus possible to interchange the attenuation filter with another, in particular new, attenuation filter having the same or a different absorption characteristic. This can be advantageous in the case of a mask change and/or if drift effects or lifetime effects occur. Installation and removal can be effected reproducibly.

As mentioned above, the attenuation filter can also be provided as a retrofitting component for later installation at an installation position at which, in the new state of the projection lens (after initial installation and adjustment by the manufacturer), no optical element was located yet or merely a placeholder element having only low optical action (for example a thin plane plate in a large region of collimated radiation) was located. Retrofitting by way of installation of the attenuation filter can be performed at the location of use of the projection lens (that is to say for example in a production hall of a chip manufacturer).

The projection exposure apparatus according to the disclosure is configured for exposing a wafer or substrate to be exposed, which is arranged in the region of the image plane of the projection lens according to the disclosure, to at least one image of a pattern of a mask, or of another pattern generation device, arranged in the object plane of the projection lens. The projection exposure apparatus has an illumination system for receiving the ultraviolet radiation with the specified working wavelength from the wavelength range of 150 nm to 370 nm of an ultraviolet radiation source and for shaping illumination radiation that is directed onto the pattern. The projection exposure apparatus furthermore has the projection lens according to the disclosure for imaging the pattern onto the wafer or onto the substrate. The ultraviolet radiation, which is changed by the pattern, travels in the form of projection radiation through the projection lens and is incident here during projection exposure operation on the attenuation filter according to the disclosure and passes through it.

BRIEF DESCRIPTION OF THE DRAWINGS

Further advantages and aspects of the disclosure emerge from the claims and the subsequent description of preferred exemplary embodiments of the disclosure, which are explained below on the basis of the figures. In the figures:

FIG. 7 shows a schematic illustration of a projection lens in accordance with a further embodiment of the disclosure.

DETAILED DESCRIPTION OF THE EXEMPLARY EMBODIMENTS

Figure 1:
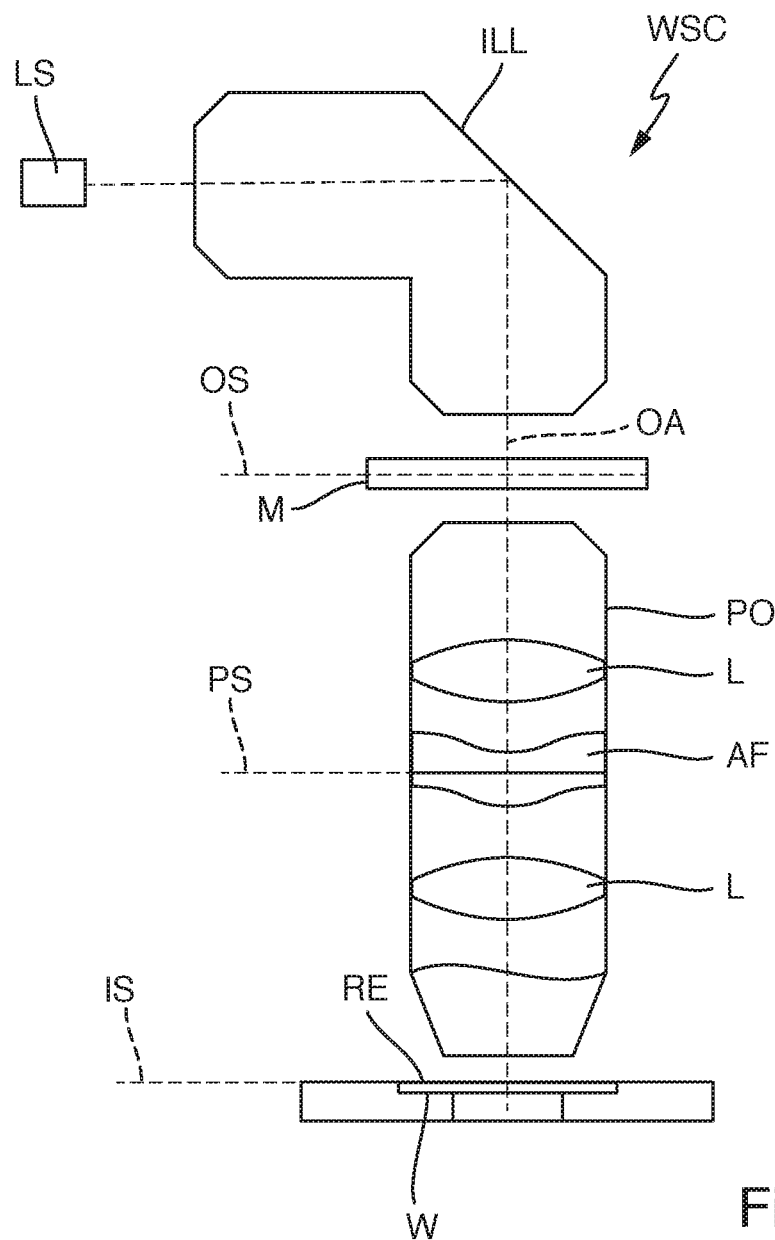
FIG. 1 shows a schematic illustration of a projection exposure apparatus including an illumination system and a projection lens with an attenuation filter according to one embodiment of the disclosure.

A microlithographic projection exposure apparatus WSC from FIG. 1 has an illumination system ILL and a projection lens PO. The illumination system ILL is configured for receiving ultraviolet radiation from an ultraviolet radiation source LS and for shaping illumination radiation, directed onto a pattern of a mask or of a pattern generation device M, from at least a portion of the received ultraviolet radiation. The projection lens PO is configured for exposure or for imaging the pattern onto a wafer or a substrate W.

In the exemplary embodiment shown, the ultraviolet radiation source LS includes an ArF excimer laser and is configured for generating ultraviolet radiation with a working wavelength of 193 nm. The illumination system ILL and the projection lens PO are designed for the working wavelength of 193 nm. Alternatively, the ultraviolet radiation source can include a mercury vapour lamp with a working wavelength of 365 nm, a KrF excimer laser with a working wavelength of 248 nm or a $F_2$ excimer laser with a working wavelength of 157 nm. Accordingly, the illumination system and the projection lens can be designed for the respective working wavelength.

The illumination radiation is directed into an illumination field in an exit plane of the illumination system ILL during exposure operation, wherein the exit plane of the illumination system and an object plane OS of the projection lens PO coincide. The illumination radiation is characterized by specific illumination parameters and is incident within the illumination field with a defined shape and size on the mask M, which is positioned optically between the illumination system ILL and the projection lens PO in the region of the exit plane or the object plane OS. The mask M bears or forms the pattern of a structure to be imaged. The radiation altered by the pattern passes in the form of projection radiation through the projection lens PO, which images the pattern on a reduced scale onto the wafer W to be exposed. A surface of the wafer W is arranged in the image plane IS of the projection lens PO, the image plane being optically conjugate with respect to the object plane of the projection lens PO, wherein at least the surface of the wafer W will generally be coated with a radiation-sensitive layer RE.

The projection lens PO has a multiplicity of optical elements L, with FIG. 1 only showing two lens elements for the sake of simplicity. In alternative embodiments, the multiplicity of optical elements can alternatively or additionally include mirrors and/or include at least three optical elements. The optical elements L are arranged between the object plane OS and the image plane IS. The projection radiation is influenced in the projection lens PO by the optical elements L.

Both the mask M and the optical elements L of the projection lens can cause undesired secondary effects, such as for example optical proximity effects or effects which negatively affect a pupil transmission. At least one attenuation filter AF is provided in the projection lens PO for correcting or compensating for such secondary effects. During projection exposure operation, the projection radiation travels through the projection lens PO and is incident on the attenuation filter AF and passes through it. In principle, the attenuation filter can be arranged, with respect to the desired correction effect, at different positions in the projection beam path along an optical axis OA between the object plane OS and the image plane IS, in particular at a similar position to the optical element to be corrected or the mask or at a position which is optically conjugate thereto. In the example of FIG. 1, in the projection lens PO, between the object plane OS and the image plane IS, at least one pupil plane PS is arranged, which is optically Fourier transformed to the object plane OS and to the image plane IS and in which the attenuation filter AF is arranged.

During the correction, an attenuation filter which is not in accordance with the disclosure itself can cause other undesired secondary effects, as will be explained below with reference to the attenuation filter AF" shown in FIG. 2.

The attenuation filter AF" has a substrate SU" and an absorption layer AL" which is arranged thereon. The substrate SU" is a plate, which is plane-parallel in principle, having a thickness TS" of 5 mm, as is indicated in FIG. 2 by way of dashed lines. A layer thickness TA" of the absorption layer AL" locally varies over the substrate, with the result that ultraviolet radiation LR1I, LR2I, which is incident during the projection exposure operation, is absorbed to varying degrees at different locations or regions Z1, Z2 of the attenuation filter AF". In the present case, the absorption layer AL" is relatively thicker at the location Z2 than at the location Z1.

During projection exposure operation, the absorption of the ultraviolet radiation LR1I, LR2I which varies locally over the substrate SU" causes a locally varying heating of the absorption layer AL" and, consequently, a locally varying heating of the substrate SU". At the location Z1, a temperature T1 becomes established, and at the location Z2, a temperature T2 becomes established, which is increased as compared to the temperature T1.

Owing to the relatively large substrate thickness TS", thermal expansion EX of the substrate SU" in absolute terms is relatively large. As a consequence, differences in any thermal expansion EX at different locations Z1, Z2 of the substrate SU" are also relatively large owing to the locally varying heating of the substrate SU", and the substrate SU" strongly deviates in terms of its shape during projection exposure operation from its original plane-parallel form, as can be seen in FIG. 2. For typical substrate materials, such as synthetic quartz glass or crystalline fluoride having a refractive index that is greater than one at the specified working wavelength, rays LR1I, LR2I, which pass through the attenuation filter AF" in each case at different locations Z1, Z2, thus have relatively large optical path length differences in the order of magnitude of EX after they have passed through the attenuation filter AF".

In addition, a change of the typically temperature-dependent refractive index of the substrate SU" takes effect via a through-passage path length for the ultraviolet radiation which passes through the substrate SU". The through-passage path length is typically of the size order of the substrate thickness TS" and is thus relatively large for a relatively large substrate thickness TS". As a consequence, differences in the refractive index at different locations Z1, Z2 of the substrate SU" likewise cause, owing to the locally varying heating up of the substrate SU", relatively large optical path length differences between rays LR1O, LR2O, which have passed through the attenuation filter AF" in each case at different locations Z1, Z2. This effect is pronounced in particular in the case of synthetic quartz glass as the substrate material.

Moreover, thermal expansion of the substrate SU", in particular in the combination shown with attachment of the attenuation filter AF" by way of attachment structures MO", which engage at the substrate SU", and, associated therewith, with clamping of the substrate SU", results in curvature of the entry-side and exit-side surface of the substrate SU". This results in a lateral offset ROF of rays LR1O, LR2O, which pass through the substrate SU" in each case at different locations Z1, Z2, relative to one another. The ray offset ROF is typically dependent on the substrate thickness TS" and is thus relatively large in the case of a relatively large substrate thickness TS". This effect is pronounced in particular in the case of $CaF_2$ as the substrate material.

The heating of the substrate SU" which varies depending on location thus has a relatively large influence on the phase or the wavefront of the ultraviolet radiation LR1O, LR2O that has passed through, which results in relatively large thermally induced wavefront variation errors and, consequently, in imaging errors which cannot be tolerated.

For estimating the order of magnitude of the contributions to the causes of a wavefront variation error, table 1 indicates a comparison between contributions to the path length change (in [nm]) in a traditional apodization filter (absorption layer of varying thickness on thick plane-parallel substrate (plate) with 5 mm thickness) and contributions in the case of attenuation filters of the same apodization effect, but with a construction according to an exemplary embodiment of the disclosure (with substrate thicknesses of 50 µm and 10 µm) for two possible substrate materials, specifically synthetic quartz glass (fused silica) "quartz" and calcium fluoride ($CaF_2$) at 193 nm wavelength.

The crystalline $CaF_2$ has a thermal conductivity and thermal expansion which is essentially higher than that of quartz glass, while the temperature dependence of the refractive index in the case of quartz glass is significantly higher than in the case of $CaF_2$ and has the opposite sign.

TABLE 1

| Substrate material | Quartz | Calcium fluoride |
|---|---|---|
| Refractive index | 1.561 | 1.502 |
| Thermal conductivity [W/mK] | 1.38 | 9.71 |
| Thermal expansion [E-6/K] | 0.51 | 18.85 |
| Temperature dependence of the refractive index [E-6/K] | 20.7 | -2.9 |
| Plate 5 mm path length by deformation (nm/K) | 1.4 | 47.3 |
| Plate 50 µm path length by deformation (nm/K) | 0.0 | 0.5 |
| Plate with 10 µm thickness path length by deformation (nm/K) | 0.0 | 0.1 |
| Plate 5 mm path length by change in refractive index (nm/K) | 103.5 | -14.5 |
| Plate 50 µm path length by change in refractive index (nm/K) | 1.0 | -0.1 |
| Plate with 10 µm thickness path length by change in refractive index (nm/K) | 0.2 | 0.0 |
| Plate 5 mm ray offset (nm/K): gradient over 10 mm | 0.8 | 31.4 |
| Plate 50 µm ray offset (nm/K): gradient over 10 mm | 0.0 | 0.0 |
| Plate with 10 µm thickness ray offset (nm/K): gradient over 10 mm | 0.0 | 0.0 |

Figure 3:
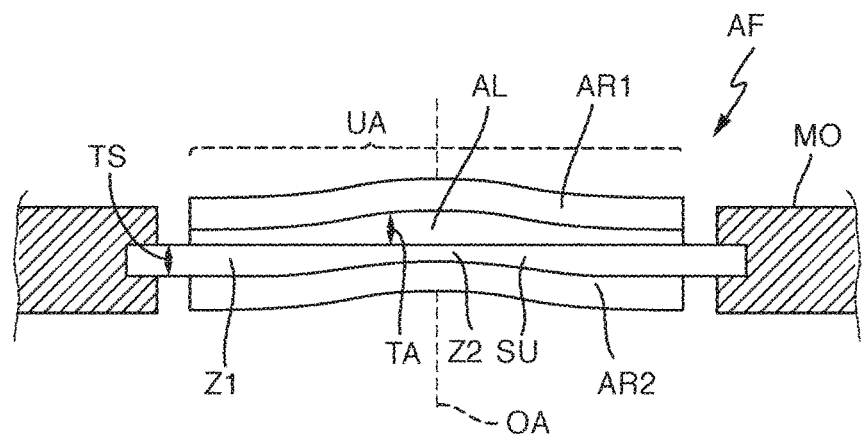
FIG. 3 shows a longitudinal section view of an embodiment of an attenuation filter according to the disclosure.

FIG. 3 shows an exemplary embodiment of an attenuation filter AF, which can be used for example in the projection lens PO of FIG. 1. The attenuation filter AF serves for the defined attenuation of the intensity of ultraviolet radiation with a specified working wavelength from a wavelength range of 150 nm to 370 nm according to a specifiable local distribution. In particular, the attenuation filter AF is designed for a working wavelength of 193 nm.

The attenuation filter AF has a substrate SU and an absorption layer AL. In the present case, the substrate is a dimensionally stable plate. The substrate consists entirely of synthetic quartz glass or crystalline fluoride, such as for example $MgF_2$ and/or $CaF_2$. The substrate SU is thus sufficiently transparent at 193 nm. The absorption layer AL is arranged immediately on an entry-side planar substrate surface of the substrate SU, such that the substrate SU carries the absorption layer AL. The absorption layer AL absorbs incident ultraviolet radiation of 193 nm according to the specifiable local distribution at different locations Z1, Z2 of a used area UA to varying degrees.

Figure 5:
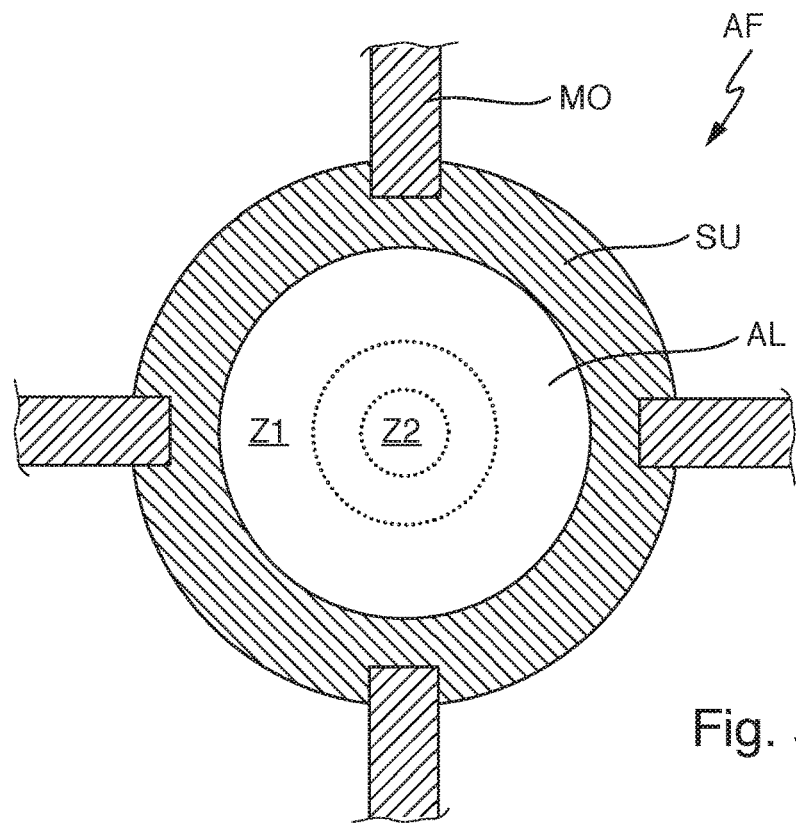
FIG. 5 shows a plan view of the attenuation filter from FIG. 1.

The used area UA is the region of the attenuation filter SU through which ultraviolet radiation passes during projection exposure operation. The used area UA corresponds to a partial surface of the substrate, as can be seen in FIGS. 3 and 5. The attenuation filter has attachment structures MO for attaching the attenuation filter AF in the projection lens PO, wherein the attachment structures MO engage on the substrate SU outside the used area UA and additionally outside the absorption layer AL. The diameter of the surface of the used area is, for example, between 50 mm and 500 mm. The used area UA has the shape of a circle or is rotationally symmetric about the optical axis OA. The substrate SU also has the shape of a circle or is rotationally symmetric. In alternative embodiments, the used area, and also the substrate, can have a different form that is adapted to the object that is to be achieved. The form of the absorption layer AL is likewise adapted to the object that is to be achieved and in the present case has a circular shape and is rotationally symmetric, as is indicated in FIG. 5 by way of dotted lines.

In the exemplary embodiment shown, the attenuation filter AF is intended to serve for apodization or filtering of the pupil transmission of the projection lens PO. An attenuation strength or absorption strength of the attenuation filter AF should vary continuously in the range of 5% to 20%, or a transmission should vary continuously in the range of 95% to 80%, wherein the attenuation filter AF should attenuate or absorb incident ultraviolet radiation in a middle or a centre Z2 of the used area UA more strongly than in a peripheral region or at a periphery Z1 of the used area UA, or should transmit more strongly at the periphery Z1 than in the centre T2. This local distribution can be specified for example by way of the pupil transmission of the projection lens PO without attenuation filter AF being measured and by determining the local distribution from a comparison of the measured pupil transmission with the desired pupil transmission of the projection lens PO.

Figure 4:
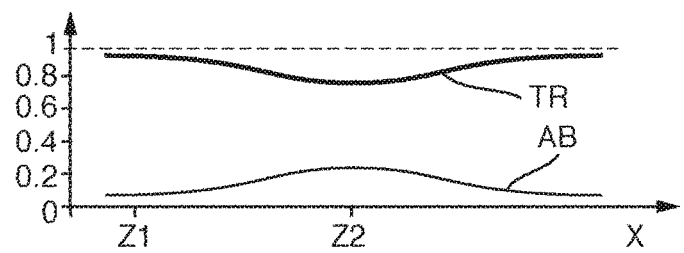
FIG. 4 shows a diagram, associated with the attenuation filter in FIG. 1, of its absorption and its transmission as a function of the location.

Here, the absorption layer AL consists entirely of an absorption layer material, which absorbs incident ultraviolet radiation of 193 nm and is largely identical or homogeneous in dependence on location, in the present case tantalum pentoxide (with an extinction coefficient of k=0.74 at 193 nm). A thickness TA of the absorption layer AL varies locally over the substrate SU in accordance with the specifiable local distribution, in the present case continuously between at most 2 nm in the centre Z2 and 0.5 nm at the periphery Z1. The absorption layer AL here has a local area coverage of 100%, or is closed. Owing to the thickness variation of the absorption layer AL, a variation of the relative absorption AB of the attenuation filter AF of between approximately 2.4% and 9.2% as a function of the location is achieved, as can be seen in FIG. 4. The transmission TR correspondingly varies in the opposite way. In other embodiments, in which the absorption strength in specific regions is intended to drop to the value zero, the absorption layer thickness in these regions can drop to the value zero, with the result that there are regions of the used area without absorption layer. The absorption layer AL with its locally varying thickness TA can be produced, for example, by initially applying the absorption layer material with a constant layer thickness onto the substrate SU using PVD, and by subsequently removing or ablating various amounts of absorption layer material at different locations Z1, Z2. It is also possible for the absorption layer to be applied with the locally varying layer thickness from the start by controlling the coating method.

Figure 2:
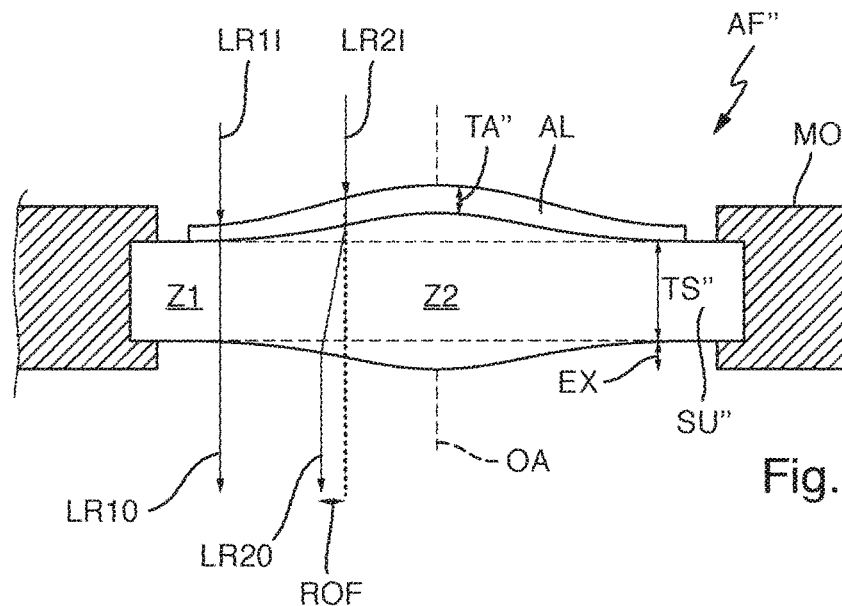
FIG. 2 shows a longitudinal section view of an attenuation filter which is not in accordance with the disclosure.

As opposed to the attenuation filter AF" from FIG. 2, the attenuation filter AF from FIG. 3 is configured such that any thermally induced wavefront variation errors in the ultraviolet radiation which has passed through the attenuation filter AF are avoided or significantly reduced as compared to known solutions. Thermally induced wavefront variation errors could arise in principle owing to a locally varying heating of the substrate SU, which is caused by the ultraviolet radiation being absorbed in a locally varying manner over the substrate.

In the present case, a thickness TS of the substrate SU is approximately 10 μm. As such, the substrate is still resistant or robust with respect to external influences. Owing to the relatively low substrate thickness TS, thermal expansion of the substrate SU in absolute terms is relatively low. As a consequence, differences in the thermal expansion at various locations Z1, Z2 of the substrate SU owing to the locally varying heating of the substrate SU are also only relatively low. In addition, a change of the temperature-dependent refractive index of the substrate SU takes effect only via a relatively short through-passage path length for the ultraviolet radiation which passes through the substrate SU. As a consequence, differences in the refractive index at various locations Z1, Z2 of the substrate SU owing to the locally varying heating of the substrate SU have a low effect. Moreover, thermal expansion of the substrate SU, in absolute terms, is relatively low and as a consequence, a curvature, caused in combination with the attachment of the substrate SU, of the entry-side and exit-side surface of the substrate SU is also relatively low. Furthermore, a ray which is affected by the curvature is laterally offset only by the relative low substrate thickness TS. As a consequence, a ray offset is relatively low. The relatively low substrate thickness TS therefore allows for any thermally induced wavefront variation error in the ultraviolet radiation that has passed through the attenuation filter AF to be kept small from the outset.

Furthermore, the thickness TS of the substrate SU varies locally, wherein the thickness variation is adapted to the absorption which varies locally over the substrate SU. In particular, the thickness variation is here adapted to a typical intensity of the incident ultraviolet radiation during exposure operation and to a locally varying heating of the substrate SU, which is to be expected, with local differences in the order of magnitude of 1 K (1 Kelvin). In the present case, the thickness TS of the substrate SU at the periphery Z1 is 10 μm and 0.2 nm less in the centre Z2. Consequently, it is possible to counteract a thermally induced wavefront variation error from the outset. The substrate SU with its locally varying thickness TS can be produced, for example, starting from a plane-parallel plate, by the thickness variation being introduced by way of nanoaspherization of the entry-side surface of the substrate SU using an ion beam. Alternatively, the exit-side surface of the substrate can have the surface deformation, or both sides can have a surface deformation.

Owing to its construction, the attenuation filter AF thus permits the substantial avoidance of a thermally induced wavefront variation error from the outset. The attenuation filter AF is moreover configured to correct wavefront variation errors which are caused by the optical elements L within the projection lens PO. As a consequence, the imaging performance of the projection lens PO from FIG. 1 is relatively good.

To reduce or avoid reflection, the attenuation filter AF has, on the entry side, an anti-reflective layer system AR1 and, on the exit side, an anti-reflective layer system AR2. Here, the anti-reflective layer system AR1 is applied on the entry-side surface of the absorption layer AL, and the anti-reflective layer system AR2 is applied on the exit-side surface of the substrate SU, for example using vacuum evaporation. Both anti-reflective layer systems AR1, AR2 each have an alternating layer stack having a layer of highly refractive, dielectric material and a layer, applied thereon, of dielectric material with a low refractive index relative thereto. In the example, magnesium fluoride ($MgF_2$) is used as the material having a low refractive index, and aluminium oxide ($Al_2O_3$) is used as the material having a high refractive index. The layers of the anti-reflective layer systems AR1, AR2 have substantially uniform layer thicknesses of approximately 32 nm ($MgF_2$) or approximately 60 nm ($Al_2O_3$) over the entire used area UA. Both layers are closed.

The very low thickness variation of the substrate SU offers the advantage that the anti-reflective layer system AR2 does not have large local angles of incidence, and thus, with uniform thickness, homogeneously renders the attenuation filter AF on the exit side anti-reflective, i.e. is uniformly effective over the entire used area UA. The very low layer thickness TA or the very low thickness variation of the absorption layer AL offers the advantage that the anti-reflective layer system AR1 does not have large local angles of incidence, and thus, with uniform thickness, homogeneously renders the attenuation filter AF on the entry side anti-reflective. In addition to the optical anti-reflection effect, the anti-reflective layer system AR1 protects the underlying, very thin absorption layer AL from harmful environmental influences, and the anti-reflective layer system AR2 protects the substrate SU.

Owing to rendering the attenuation filter AF anti-reflective, attenuation of the intensity of the ultraviolet radiation by way of reflection at the attenuation filter AF is negligible compared to the absorption. As a result, a variation in the relative transmittance of the attenuation filter AF of between 0.95 and 0.8 as a function of the location x is achieved, as can be seen in FIG. 4.

Figure 6:
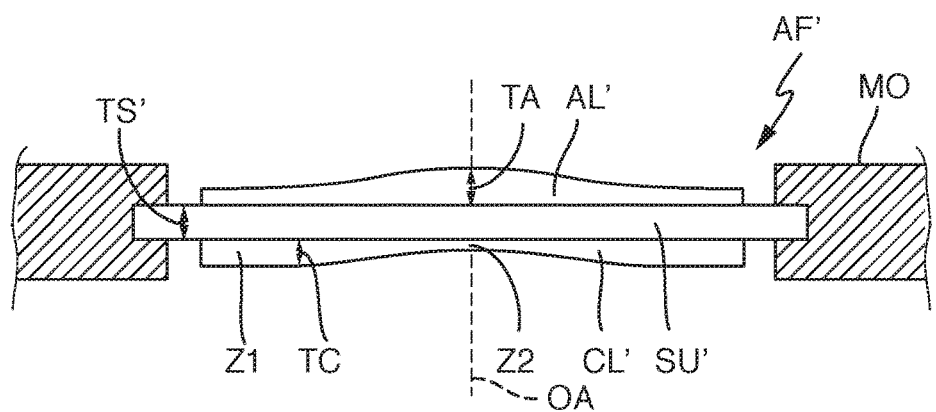
FIG. 6 shows a longitudinal section view of an attenuation filter in accordance with a further embodiment of the disclosure.

FIG. 6 shows a further exemplary embodiment of an attenuation filter AF' according to the claimed disclosure, wherein here and below, identical reference signs are used, for the purposes of better comprehension, not only for identical elements but also for elements of equivalent function, in as far as reference can be made to the description thereof. In contrast to the attenuation filter AF from FIGS. 1 and 3 to 5, the attenuation filter AF' from FIG. 6 has a wavefront correction layer CL which is separate from the absorption layer AL. This layer is arranged on the exit-side surface of a substrate SU', in direct contact therewith, which surface is situated opposite the absorption layer AL, with the result that the substrate SU' carries the wavefront correction layer CL. As compared to the exemplary embodiment from FIGS. 1 and 3 to 5, the substrate SU' is a plane-parallel plate, which simplifies production. In addition, and in contrast, anti-reflective layer systems have been omitted for reasons of simplicity in the attenuation filter AF' from FIG. 6. In alternative embodiments, at least one anti-reflective layer system may be provided, in particular on the wavefront correction layer.

The wavefront correction layer CL consists entirely of a correction layer material having a refractive index of greater than one at the specified working wavelength of 193 nm, such as e.g. $SiO_2$, $MgF_2$, $CaF_2$, $BaF_2$ and/or $Al_2O_3$ and is sufficiently transparent at 193 nm. A thickness TC of the wavefront correction layer CL varies continuously over the substrate SU, wherein the local thickness variation is adapted to the absorption which varies locally over the substrate SU. In particular, the thickness variation is here adapted to a typical intensity of the incident ultraviolet radiation during exposure operation and to a locally varying heating of the substrate SU, which is to be expected, with local differences in the order of magnitude of 1 K (1 Kelvin). In the present case, the thickness TC of the wavefront correction layer CL at the periphery Z1 is 10 nm and approximately 0.2 nm less in the centre Z2. The wavefront correction layer CL is closed. The wavefront correction layer CL with its locally varying thickness TC can be produced, for example, by initially applying the correction layer material with a constant layer thickness onto the substrate SU', and by subsequently removing or ablating various amounts of correction layer material at different locations Z1, Z2. Alternatively, the thickness variation of the wavefront correction layer can be produced, for example, by applying different amounts of correction layer material at different locations Z1, Z2 over the substrate SU'. It may be reasonable here for the correction layer thickness to be able to drop to the value zero in certain areas, with the result that there may be areas or regions of the used area without wavefront correction layer.

With the wavefront correction layer CL, it is possible to counteract a thermally induced wavefront variation error from the outset. In this case, a thickness TS' of the substrate SU' does not need to vary locally.

FIG. 7 shows a further exemplary embodiment of a projection lens PO' according to the claimed disclosure, wherein here and below, identical reference signs are again used, for the purposes of better comprehension, not only for identical elements but also for elements of equivalent function, in as far as reference can be made to the description thereof. The projection lens PO' has a multiplicity of optical elements in the form of six lens elements L1, L2, L3, L4, L5, L6. The optical elements are arranged between the object plane OS and the image plane IS in a housing POH of the projection lens PO'. Furthermore, the projection lens has three attenuation filters AF1, AF2, AF3, which are arranged in the projection beam path along the optical axis OA between the object plane OS and the image plane IS and can be constructed like the attenuation filters of the exemplary embodiments from FIGS. 1 and 3 to 6. During projection exposure operation, the projection radiation travels through the projection lens and in the process is incident in each case on the used area of the corresponding attenuation filter and passes through it.

In the example of FIG. 7, in the projection lens PO', between the object plane OS and the image plane IS, two pupil planes PS1, PS2 are arranged, which are optically Fourier transformed to the object plane OS and to the image plane IS, and an intermediate image plane IIS which is optically conjugate to the object plane OS. The attenuation filter AF1 is arranged in the pupil plane PS1, the attenuation filter AF2 is arranged in the intermediate image plane IIS, and the attenuation filter AF3 is arranged in the pupil plane PS2. Each of the attenuation filters predominantly serves for correcting disturbances at those optical elements that are arranged at a similar position to the respective attenuation filter or at a position which is optically conjugate thereto in the projection beam path. In detail, the attenuation filters AF1, AF3 serve for correcting or compensating for undesired secondary effects, which arise at an exit side of the lens element L2, an entry side of the lens element L3, an exit side of the lens element L5, and/or an entry side of the lens element L6. The attenuation filter AF2, among other things, serves for correcting undesired secondary effects caused at an entry side of the lens element L1, an exit side of the lens element L4 and/or an entry side of the lens element L5.

The attenuation filters do not need to be arranged exactly in the respective plane (pupil plane, field plane), but can be arranged in the proximity or in the region of the respective plane. Being arranged in proximity to a plane means, among other things, that the respective attenuation filter is spatially closer to the corresponding plane along the projection beam path than to another plane. For more accurately quantifying the position of one of the attenuation filters in the projection beam path, for example the subaperture ratio can be used, as is described in WO 2014/139719 A1. In the object plane OS, the image plane IS and the intermediate image plane IIS, which can also be referred to as field planes, |SAR|=0. In the pupil planes PS1, PS2 |SAR|=1. An absolute value of the subaperture ratio in a pupil-near attenuation filter is greater than 0.5 and at most 1, preferably it is in the range between 0.75 and 1. An absolute value of the subaperture ratio in a field-near attenuation filter is less than 0.5 and at least 0, preferably it is in the range between 0 and 0.25. It may also be reasonable to arrange an attenuation filter in an intermediate position, that is to say neither very close to a field plane nor very close to a pupil plane, for example in a region with |SAR|=0.25 to 0.75.

The attenuation filters AF1, AF2, AF3 are configured as structurally interchangeable attenuation filters. As a result, each attenuation filter can be removed from the housing POH and be interchanged with a different, in particular new, attenuation filter having in particular an identical or a different absorption characteristic, as is indicated in FIG. 7 by the arrows P1, P2, P3. This can be advantageous in the case of a change of the mask M and/or if drift effects or lifetime effects occur after the original installation and adjustment of the projection lens PO'. Installation and removal are effected reproducibly.

Furthermore, the attenuation filters offer the advantage that they are relatively thin and can thus be arranged between optical elements which are arranged relatively close to one another in the projection lens PO'. In the exemplary embodiment shown, a distance D between the lens element L5 and the lens element L6 on the optical axis is only 1 mm.

In the exemplary embodiments shown, the respective attenuation filter has at least one absorption layer. The configuration of the substrate with a locally varying substrate thickness or the configuration of the substrate in combination with a separate wavefront correction layer with a locally varying correction layer thickness over the substrate, with a thickness of the substrate being less than 100 µm, can also be advantageous, independently of the absorption layer, for correcting wavefront variation errors caused by other elements in the projection lens and can represent a patentable disclosure. In other words, the absorption layer can be dispensed with. Such a component can be referred to as a wavefront correction filter. The relatively low thickness allows for an arrangement of the wavefront correction filter at any position in the projection lens. By way of example, the wavefront correction filter would fit in the projection lens PO' from FIG. 7 between the lens element L5 and the lens element L6.

What is claimed is:

1. An attenuation filter, comprising:
   a substrate which is configured to transmit at least 90% of radiation at a wavelength of from 150 nm to 370 nm; and
   an absorption layer arranged on the substrate,
   wherein:
      the absorption layer is configured to absorb incident radiation at the wavelength to varying degrees according to a local distribution of the radiation at different locations of a used area of the absorption layer; and
      the substrate is at most 20 µm thick.

2. The attenuation filter of claim 1, wherein the attenuation filter is configured to reduce or avoid a thermally induced wavefront variation error in ultraviolet radiation which has passed through the attenuation filter and which is due to a locally varying heating of the substrate caused by the absorption of the ultraviolet radiation which varies locally over the substrate.

3. The attenuation filter according to claim 1, wherein the substrate is at most 10 µm thick.

4. The attenuation filter according to claim 1, wherein the substrate is at least 5 µm thick.

5. The attenuation filter according to claim 1, wherein the substrate is dimensionally stable.

6. The attenuation filter according to claim 1, wherein the substrate has a locally varying thickness adapted to the absorption which a locally varying absorption of ultraviolet radiation which varies locally over the substrate.

7. The attenuation filter according to claim 1, wherein the absorption layer consists essentially of at least one material selected from the group consisting of a metal, a carbide, and a metal oxide.

8. The attenuation filter according to claim 1, wherein the absorption layer consists essentially of at least one material selected from the group consisting of tantalum pentoxide (Ta2O5), hafnium oxide (HfO2) and/or aluminium oxide (Al2O3).

9. The attenuation filter according to claim 1, wherein the substrate consists essentially of synthetic quartz glass (SiO2) or crystalline fluoride.

10. The attenuation filter according to claim 1, wherein the absorption layer is configured to absorb radiation at the wavelength more strongly in a center of the used area than in a peripheral region of the used area.

11. A projection lens, comprising:
   a multiplicity of optical elements arranged between an object plane of the projection lens and an image plane of the projection lens; and
   an attenuation filter according to claim 1,
   wherein the attenuation filter is arranged in a beam path between the object plane and the image plane, and the projection lens is configured to image a pattern in the object plane into the image plane.

12. The projection lens of claim 11, wherein:
   the projection lens has a pupil plane between the object plane and the image plane;

the pupil plane is optically Fourier transformed to the object plane and to the image plane; and the attenuation filter is arranged in the pupil plane or in the proximity of the pupil plane.

13. The projection lens of claim 11, wherein the attenuation filter is structurally interchangeable.

14. A projection exposure apparatus, comprising:

an illumination system configured to illuminate a pattern of a mask;

a projection lens configured to image the illuminated pattern into a wafer, wherein the projection exposure apparatus comprises an attenuation filter according to claim 1.

15. The projection exposure apparatus of claim 14, wherein:

the mask is arranged in an object plane of the projection lens;

the wafer is arranged in an image plane of the projection lens;

the projection lens has a pupil plane between the object plane and the image plane;

the pupil plane is optically Fourier transformed to the object plane and to the image plane; and the attenuation filter is arranged in the pupil plane or in the proximity of the pupil plane.

16. The projection exposure apparatus of claim 14, wherein the attenuation filter is structurally interchangeable.

17. A method of using a projection exposure apparatus comprising an illumination system and a projection lens, the method comprising:

using the illumination system to illuminate a pattern of a mask;

using the projection lens to project an image of the illuminated pattern into a wafer, wherein the projection lens comprises an attenuation filter according to claim 1.

18. An attenuation filter, comprising:

a substrate which is configured to transmit at least 90% of radiation at a wavelength of from 150 nm to 370 nm; and an absorption layer arranged on the substrate, wherein:

the absorption layer is configured to absorb incident radiation at the wavelength to varying degrees according to a local distribution of the radiation at different locations of a used area of the absorption layer;

the substrate is less than 100 µm thick; and the substrate has a locally varying thickness adapted to the absorption of ultraviolet radiation which varies locally over the substrate.

19. The attenuation filter according to claim 18, further comprising a wavefront correction layer arranged on the substrate, wherein the correction layer comprises a material having a refractive index that is greater than one at the wavelength, and the correction layer has a locally varying correction layer thickness adapted to a locally varying absorption of ultraviolet radiation of the substrate.

20. The attenuation filter according to claim 18, wherein the absorption layer comprises an absorption layer material configured to absorb the radiation at the wavelength, and the absorption layer has a thickness varies locally over the substrate according to the local distribution.

* * * * *